United States Patent
Miyasako (12) 
(10) Patent No.: US 6,230,721 B1
(45) Date of Patent: May 15, 2001

(54) PROCESSING APPARATUS AND METHOD, ROBOT APPARATUS

(75) Inventor: Hisaaki Miyasako, Ayase (JP)

(73) Assignee: Shibaura Mechatronics Corporation, Kanagawa-Ken (JP)

( * ) Notice: Subject to any disclaimer, the term of this patent is extended or adjusted under 35 U.S.C. 154(b) by 0 days.

(21) Appl. No.: 09/297,290
(22) PCT Filed: Oct. 23, 1997
(86) PCT No.: PCT/JP97/03832
 § 371 Date: Apr. 28, 1999
 § 102(e) Date: Apr. 28, 1999
(87) PCT Pub. No.: WO98/19333
 PCT Pub. Date: May 7, 1998

(30) Foreign Application Priority Data

Oct. 30, 1996 (JP) .................................................. 8-288376

(51) Int. Cl.[7] .............................. B08B 3/00; B08B 5/00
(52) U.S. Cl. ........................... 134/61; 134/66; 134/133; 134/902
(58) Field of Search .............................. 134/18, 42, 61, 134/66, 133, 902; 901/23

(56) References Cited

U.S. PATENT DOCUMENTS

| | | | |
|---|---|---|---|
| 4,728,252 | * 3/1988 | Lada et al. | 414/744 R |
| 4,797,061 | * 1/1989 | Munakata | 901/23 |
| 5,016,489 | * 5/1991 | Yoda | 901/23 |
| 5,565,034 | * 10/1996 | Nanbu et al. | 134/902 |
| 5,587,637 | * 12/1996 | Ohyama | 901/23 |
| 5,901,613 | * 5/1999 | Forslund | 901/23 |

FOREIGN PATENT DOCUMENTS

| | | |
|---|---|---|
| 5-29289 | 2/1993 | (JP) . |
| 7-193113 | 7/1995 | (JP) . |

* cited by examiner

Primary Examiner—Randy Gulakowski
Assistant Examiner—Saeed Chaudhry
(74) Attorney, Agent, or Firm—Christensen O'Connor Johnson Kindness PLLC (57) ABSTRACT

The present inventions provides a processing apparatus to enable a plurality of processing sections to be installed in a smaller space. The apparatus has a plurality of processing sections arranged at up-down two stages and supplies a material from a processing section situated at one end of either one of an upper or a lower stage. The material is processed at the processing section at one of the upper stage or lower stage and then processed at the other processing section. And it is processed at the processing section situated at one end of the other and collected.

5 Claims, 6 Drawing Sheets

PROCESSING APPARATUS AND METHOD, ROBOT APPARATUS

TECHNICAL FIELD

The present invention relates to a processing apparatus and method for sequentially performing processing on a material, such as a glass substrate for a liquid crystal, a semiconductor wafer, etc., at a plurality of processing units and to a robot apparatus for conveying the above-mentioned material.

BACKGROUND ART

For example, in a manufacturing process for forming a circuit pattern on a material, such as a glass substrate for a liquid crystal, a semiconductor wafer, etc., it is required that various kinds of processing be performed on the material and it is required that, as one such processing, the material be washed to a high purity level.

In the washing of a material to be washed, various kinds of washing means (processing sections) are known, such as an ultraviolet ray irradiation means for irradiating the material with the ultraviolet ray and decomposing an organic matter for removal, a brush washing means for washing a material which is conveyed with a brush, while applying a chemical solution, etc., to the conveyed material, and a spin washing means for applying a washing solution, such as a chemical solution, to a material while being spun with the material retained on a table. In the case where the washing processing is done on the material with the use of a plurality of washing means, a conveying means (processing section) is also provided for conveying the material to and from these washing means.

In order to increase the purity level of the material, the material is washed by as many washing means as possible out of the above-mentioned washing means. In this case, it has been normal practices to juxtapose utilized washing means in a plane in a clean room and sequentially convey the washing material to and from a plurality of washing means by conveying means.

If, however, the plurality of washing means and conveying means are arranged in a plane, a greater space was sometimes taken up by the washing means and conveying means in the clean room. It is required that a space be utilized in the clean room as effectively as possible. It is, therefore, desirable to decrease the occupation space of the plurality of washing means and conveying means.

If the above-mentioned material is to be conveyed to and from the juxtaposed washing means, it is only necessary to continuously convey the material by the conveyor in the case where the washing processing can be continuously performed by the washing means. In the case where, however, the washing processing by the washing means cannot be continuously done such as the spin washing, it has been the practice to convey the material by a robot apparatus constituting the above-mentioned conveying means which is one of the processing units.

When the robot apparatus is used as the conveying means, there is sometimes the case where this robot apparatus is run along a plurality of juxtaposed washing means. In this case, a track is provided over a range over which the robot apparatus is run.

There is sometimes the case where, when the convey-in/convey-out of the washing material by the robot apparatus is done, a washing solution drops from the material onto the above-mentioned track. Use is sometimes made, as a washing solution, of, in addition to pure water, a chemical solution of high acidity for instance. For this reason, there was sometimes the case where, if the chemical solution is used as the washing solution, the chemical solution dropping from the material corroded the track and caused an injury to cables for controlling the above-mentioned robot apparatus.

Further, there is sometimes the case where, when the material is conveyed by the robot apparatus to a predetermined washing means, until the washing of the material by the washing means is completed, the material washed at a previous step need be kept in a standby state with the material retained. In this case, when the standby time becomes longer, the washing solution deposited on the material in the previous step dried up and there was sometimes the case where a spot, etc., was formed on the material.

The above-mentioned "space problem" may arise not only in the case where the material is subjected to wash processing but also may arise even in various steps involved. In the case where, for example, a resist is coated on the material, a plurality of processing units has to be provided, such as a coating device, heating device and preheating device, thus producing a similar problem.

DISCLOSURE OF INVENTION

It is accordingly one object of the present invention to provide a processing apparatus and method which can install a plurality of processing sections in a smaller space.

Another object of the present invention is to provide a processing apparatus which, in the case where, in order to pass a material between processing sections, the robot apparatus is run along the processing section, prevents a wash solution from dropping from the material onto a track, etc., of the robot apparatus.

Another object of the present invention is to provide a processing apparatus which, even if a material passed between processing sections is retained and set in a standby state, can avoid drying-up of the material.

According to one preferred embodiment of the present invention, a processing apparatus is provided having a plurality of processing sections and adapted to sequentially convey a material to these processing sections, characterized in that the plurality of processing sections are arranged in up/down two stages.

By doing so, an occupation area taken up by the plurality of processing sections can be made smaller than in the case where these processing sections are arranged in a plane.

According to one preferred embodiment of the present invention, there is provided a processing apparatus for processing a material, characterized by comprising:

a plurality of processing sections arranged at up/down two stages;

a loader section arranged opposite to a processing sections situated at one end of any one of that upper stage or that lower stage and retaining a not yet processed material;

an unloader section arranged opposite to a processing section situated at one end of the other of the upper stage or lower stage and storing a processed material;

a first passing means for supplying the not yet processed material from the loader section to the processing section situated at the one end of the upper stage or lower stage; and a second passing means for receiving the material from the processing section situated at the other end of any one of the upper stage or lower stage and supplying the material to the processing section situated at the other end of the other of the upper stage or lower stage.

By doing so, an occupation area taken up to install a plurality of processing sections can be made smaller than they are arranged in a plane.

According to one preferred embodiment of the present invention, there is provided a method for conveying and processing a material, characterized by comprising:

a supplying step of supplying a not yet processed material at a predetermined height;

a first processing step of processing the material, which is supplied and conveyed from the supplying step, at a processing section arranged at a height substantially the same as that at which the material is conveyed;

a height varying step of varying the height at which a processed material processed at the first processing step is conveyed;

a second processing step of processing the material at that processing section located at a height position to which the height is varied by the height varying step; and a storing step for storing the material processed by the second processing step.

By doing so, the material can be processed at different heights at which the material is conveyed and a space for processing the material can be effectively utilized in a three-dimensional way.

According to one preferred embodiment of the present invention, there is provided a robot apparatus including a first arm and second arm having a plurality of links connected to be swingable and having setters for retaining a material at a forward end and movable in an extension/contraction motion, characterized in that the setter of the first arm is located at a higher position than the setter of the second arm and, with the material retained at the second arm, nozzles are provided to direct the liquid toward the retained material.

By doing so, it is possible to prevent drying-up of a surface of the material retained at the second arm situated at a lower side. It is also possible to prevent the deposition of a liquid onto the material retained on the setter of the first arm situated at the upper side, that is, the deposition of a liquid onto the material which is used to prevent drying-up of the surface of the material retained at the second arm.

BEST MODE OF CARRYING OUT THE INVENTION

One embodiment of the present invention will be explained below with reference to the accompanying drawings.

Figure 1:
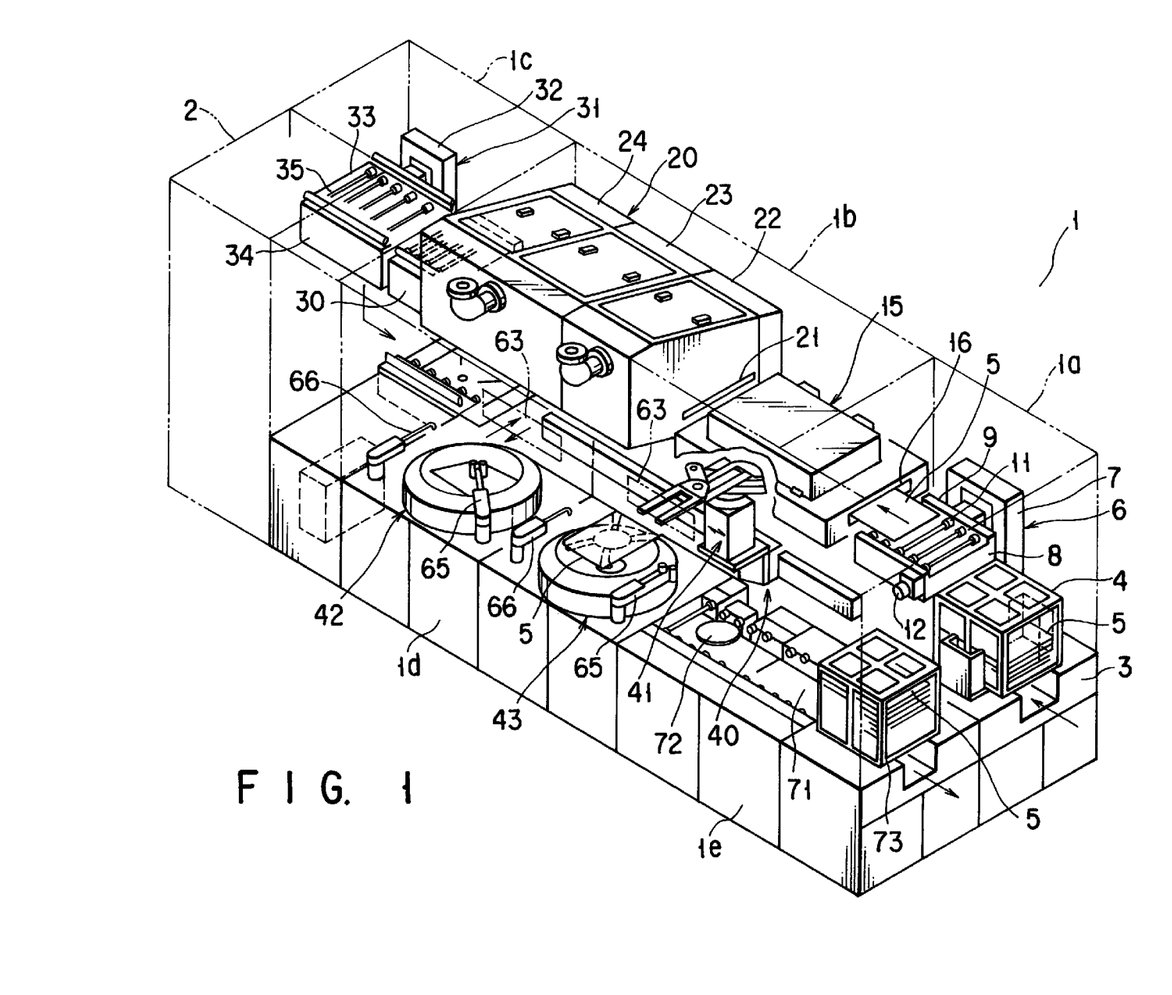
FIG. 1 is a schematic view generally showing one embodiment of the present invention.

A processing apparatus of the present invention as shown in FIG. 1 represents a wash processing apparatus 1 for subjecting a glass substrate, for a liquid crystal, as a washing material to wash processing. The washing processing apparatus 1 has a plurality of processing units as indicated by a dot-dash line in FIG. 1, that is, first through fifth processing units 1a to 1e in the present embodiment, the first through third processing units 1a through 1c and fourth, fifth processing units 1d, 1e being arranged in two rows. It is to be noted that 2 in FIG. 1 shows an electric equipment unit.

In the first processing unit 1a a loader section 4 is arranged on a mount base 3. In the loader unit 4, a plurality of glass substrates 5 for a liquid crystal are stacked and held in place and, by a conveying mechanism, not shown, provided on the mount base 3, the glass substrates 5 for a liquid crystal are conveyed one by one from below.

The glass substrate 5 for a crystal liquid conveyed from the loader 4 is sent by a first passing mechanism 6 to the second processing unit 1b. The first passing mechanism 6 has an upright support post 7. In the support post 7 a roller unit 8 is provided which is up/down drivable by a drive source not shown. The roller unit 8 has a frame 9 and a plurality of rollers 11 are rotatably mounted on the frame 9 with their axes in parallel. A drive source 12 is provided on one side of the frame 9 to rotationally drive the roller 11.

The roller unit 8 has its upper surface lowered to a height level the same as that of the glass substrate 5 conveyed from the loader 4, thus being set in a standby state. The glass substrate 5 for a liquid crystal conveyed from the loader section 4 is supplied onto the roller unit 8. The roller unit 8 receiving the glass substrate 5 for a liquid crystal is lifted, supplying the glass substrate 5 for a liquid crystal to an ultraviolet irradiation apparatus 15 mounted at a predetermined height level in the second processing unit 1b.

The above-mentioned ultraviolet irradiation apparatus 15 has a supply hole 16 formed at one side and the above-mentioned roller unit 8 is lifted up to allow the glass substrate 5 for a liquid crystal which is placed on its upper surface to be brought to a height level equal to that of the supply hole 16. Then the rollers 11 are rotationally driven by the drive source 12, thus supplying the glass substrate 5 for a liquid crystal into the ultraviolet irradiation apparatus 15.

The above-mentioned ultraviolet irradiation apparatus 15, though not shown in detail, has conveying rollers for conveying the glass substrate 5 for a liquid crystal and an ultraviolet ray lamp for irradiating, with an ultraviolet ray, the glass substrate for a liquid crystal conveyed by the conveying rollers and, by subjecting the substrate to the ultraviolet ray, causes a breakdown and removal of organic matter deposited on the substrate 5 for a liquid crystal.

The above-mentioned second processing unit 1b has a brush washing unit 20 arranged adjacent to, and at the same height as, the ultraviolet ray irradiation apparatus 15 and a conveying means, not shown, provided therein for continuously conveying the glass substrate 5 for a liquid crystal processed by the ultraviolet ray irradiation apparatus 15.

The above-mentioned brush washing unit 20 has a neutral chamber 22 having a supply hole 21 at one side for supplying the glass substrate for a liquid crystal and supplied at the other side with dry air or inert gas to restrict an entry of a liquid or gas from an outside, a brush washing chamber 23 for effecting brush washing while blowing a washing solution, such as a chemical solution, on the glass substrate 5 for a liquid crystal passing through the neutral chamber 22 and a shower chamber 24 for shower-washing, with pure water, the glass substrate for a liquid crystal which has been washed in the brush washing chamber 23, these chambers being sequentially arranged in that order. A delivery hole, not shown, is provided in the shower chamber 24 to deliver the shower-washed glass substrate 5 for a liquid crystal.

The glass substrate 5 for a liquid crystal delivered from a discharge outlet of the shower chamber 24 is received, through a passing roller unit 30 (stationary roller unit), by a second passing mechanism 31 having a structure substantially the same as that of the above-mentioned first receiving mechanism 6. The second receiving mechanism 31 has a support post 32. On the support post 32 a movable type roller unit 33 is provided which is up/down drivable by a drive source not shown. This movable type roller unit 33 has a first drain pan 34 having a top-open bottom. A plurality of rollers 35 are mounted at the first drain pan 34 such that these rollers are rotatable with their axes in parallel to each other. A drive source 34a (shown in FIG. 2) is provided at one side of the first drain pan 34 and the above-mentioned rollers 35 are rotationally driven by the drive source 34a.

Figure 2:
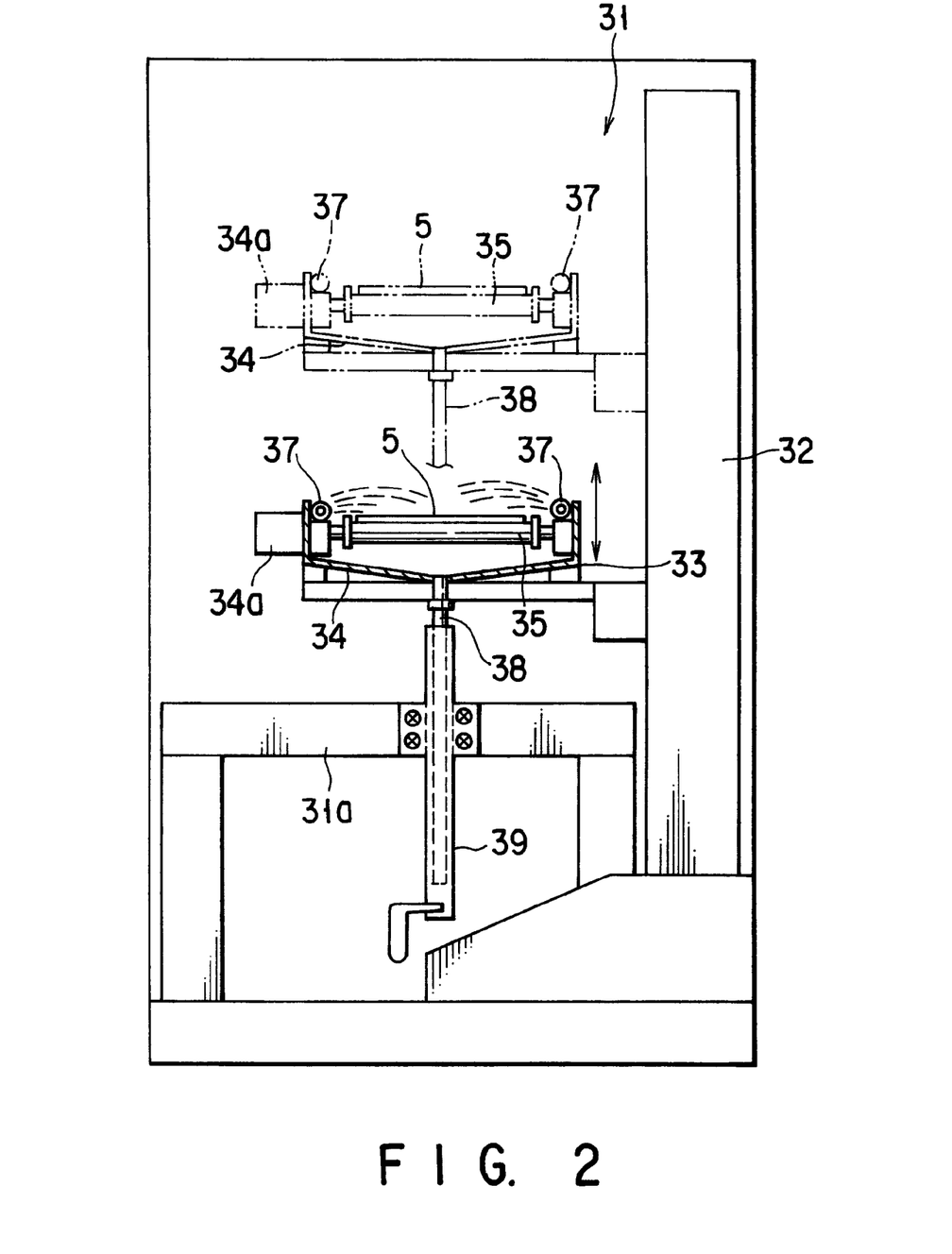
FIG. 2 is a side view showing a second passing mechanism of the same.

The movable type roller unit 33 is lifted up to substantially the same height as that of the glass substrate 5 for a liquid crystal sent from the discharge outlet of the shower chamber 24, being set in a standby state. When the glass substrate 5 for a liquid crystal delivered from the shower chamber 24 is received by the movable type roller unit 33, the movable type roller unit 33 is lowered.

The glass substrate 5 for a liquid crystal placed on the movable type roller unit 33 is picked up by a robot 41 constituting a convey-in/convey-out mechanism 40 (constituting one processing section) as a robot apparatus and is supplied to either one of a first spin processing section 42 and second spin processing section 43 arranged in a side-by-side way in the fourth processing unit 1d.

The glass substrate 5 for a liquid crystal passed to the movable type roller unit 33 of the above-mentioned second passing mechanism 31 causes a stain, etc., if being dried before being passed to the robot 41 of the convey-in/convey-out mechanism 40. In order to prevent this, pure water is sprinkled thereon as a liquid for preventing the substrate from drying.

That is, the movable type roller unit 33 has the above-mentioned first drain pan 34 having the above-mentioned bottomed box-like configuration and pipe-like shower nozzles 37 are arranged on both upper sides of the first drain pan 34. Pure water is jetted from the respective shower nozzles 37 toward the glass substrate 5 for a liquid crystal which is retained at the movable type roller unit 33.

The upper end of the movable pipe 38 is connected to the bottom of the above-mentioned drain pan 34. The movable pipe 38 is so mounted as to be suspended. The movable pipe 38 is slidably inserted into a fixed pipe 39 larger in diameter from the pipe 38. The fixed pipe 39 is fixed to a mount 31a of the second passing mechanism 31 on an intermediate way and its lower end portion is connected to a spent liquid section, not shown. The pure water is jetted toward the glass substrate 5 for a liquid crystal retained at the movable type roller unit 33 and discharged from the first drain pan 34 through the movable pipe 38 and fixed pipe 39.

The movable pipe 38 is connected to the first drain pan 34 and inserted into the fixed pipe 39 and, even when the movable roller unit 33 is up/down movable, it is possible to effect a positive discharge of the drain from the first drain pan 34.

That is, in the case where, normally, a drain is discharged from the movable section, use is made of a flexible tube so as to correspond to a movement of the movable section. In this case, since the flexible tube is set to a length over which the movable section can be lifted, if being moved down, it is bent and projected sideways. For this reason, a space has to be secured for allowing the above-mentioned flexible tube to be bent sideways and the flexible tube is repeatedly bent due to the up/down motion of the movable section, so that the bending portion has been damaged at an earlier time.

According to the present invention, however, the movable pipe 38 was connected to the first drain pan 34 without using the flexible tube and the movable pipe 38 was slidably inserted into the fixed pipe 39. For this reason, since the movable pipe 38 is slidably moved in the fixed pipe 39 due to the up/down motion of the first drain pan 34, only a space necessary to mount the fixed pipe 39 is secured and there is no chance that an earlier damage will occur due to the bending of such a flexible tube.

Figure 6:
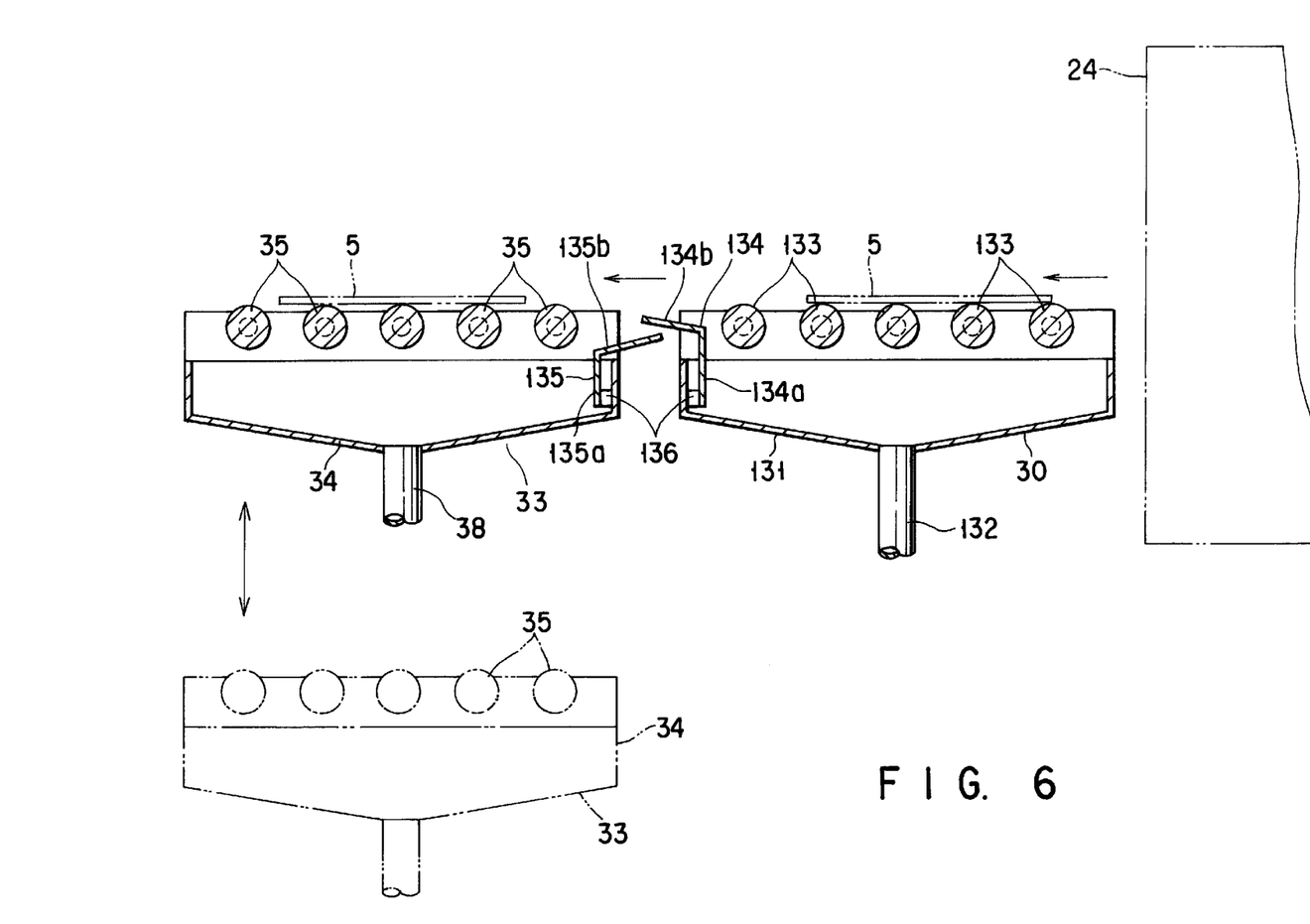
FIG. 6 is across-sectional view showing a movable roller unit and fixed roller unit.

As shown in FIG. 6, the passing roller unit 30 has a second drain pan 131 as in the case of the movable type roller unit 33. In the second drain pan 131, a drain tube 132 is downwardly inclined toward a center area of a bottom and a plurality of rollers 133 are rotatably mounted at predetermined intervals between a pair of opposite side walls with their axes in parallel. And the rollers 133 are rotationally driven by a drive source not shown.

Therefore, the glass substrate 5 for a liquid crystal conveyed from the above-mentioned shower chamber 24 onto the rollers 133 of the above-mentioned passing roller unit 30 is passed onto the rollers 35 of the movable type roller unit 33 due to a rotational drive of the rollers 133.

A first water-proof cover 134 and second water-proof cover 135 are provided on the side walls of the drain pans 131, 34 of the passing roller unit 30 and movable type roller unit 33 which are brought to face each other when the movable type roller unit 33 is brought to a lifted position.

The respective water-proof covers 134, 135 have vertical sections 134a, 135a and inclined sections 134b, 135b and the lower end portions of the vertical sections 134a, 135a are attached to the inner surfaces of the side walls through spacers 136. By doing so, the inclined sections 134b, 135b of the respective water-proof covers 134, 135 are outwardly projected from the sidewalls of the respective drain pans 131, 34 and downwardly inclined toward the inner sides of the respective drain pans 131, 34.

With the movable type roller unit 33 in the lifted state, the inclined section 134b of the first water-proof cover 134 at the passing roller unit 30 on the upstream side of the conveying direction of the glass substrate 5 for a liquid crystal is situated in an overlapped relation above the second water-proof cover 135 provided at the movable type roller unit 33.

In the case where, in this arrangement, the glass substrate 5 for a liquid crystal washed in the shower chamber 24 is passed from the fixed type roller unit 30 to the movable type roller unit 33, the washing solution dropping from the glass substrate 5 drops onto the inclined sections 134b, 135b of the water-proof covers 134, 135 and flows along the inclined section into the drain pans 131, 34. For this reason, the washing solution dropping from the glass substrate 5 for a liquid crystal is prevented from being dispersed.

Since the inclined sections 134, 135 of the paired water-proof covers 134, 135 are set in an overlapped relation, there is no possibility that the washing solution will be dispersed from a clearance between the respective roller units 30, 33.

Further, even if the washing solution is deposited onto the lower surfaces of the water-proof covers 134, 135 and flows from the inclined sections 134b, 135b onto the vertical sections 134a, 135a, since the lower ends of the vertical sections 134a, 135a are attached through the spacers to the inner surfaces of the sidewalls of the drain pans 34, 131, there is no possibility that the washing solution flowing along the lower surfaces of the water-proof covers 134, 135 will drop outside the drain pans 131, 34.

Figure 3:
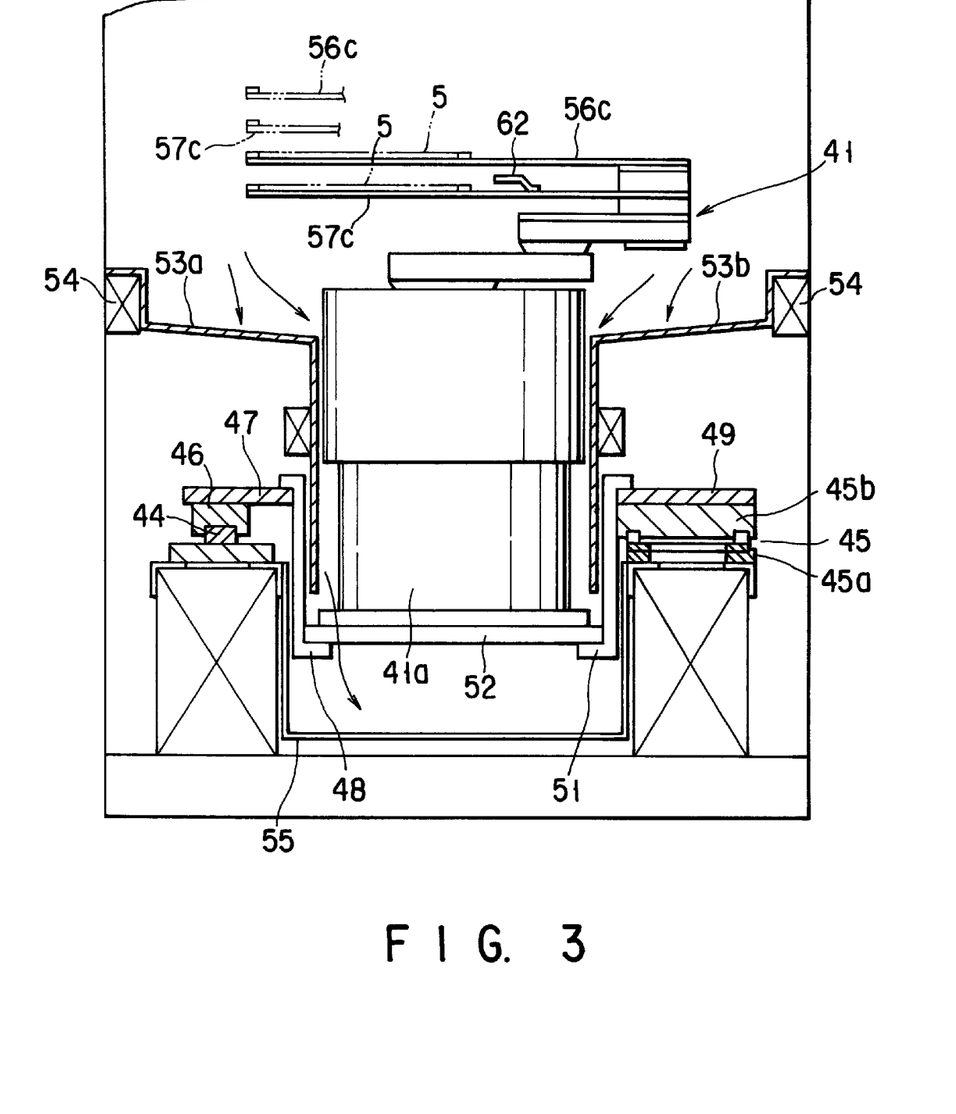
FIG. 3 is a side view showing a state in which a robot is arranged.
Figure 5:
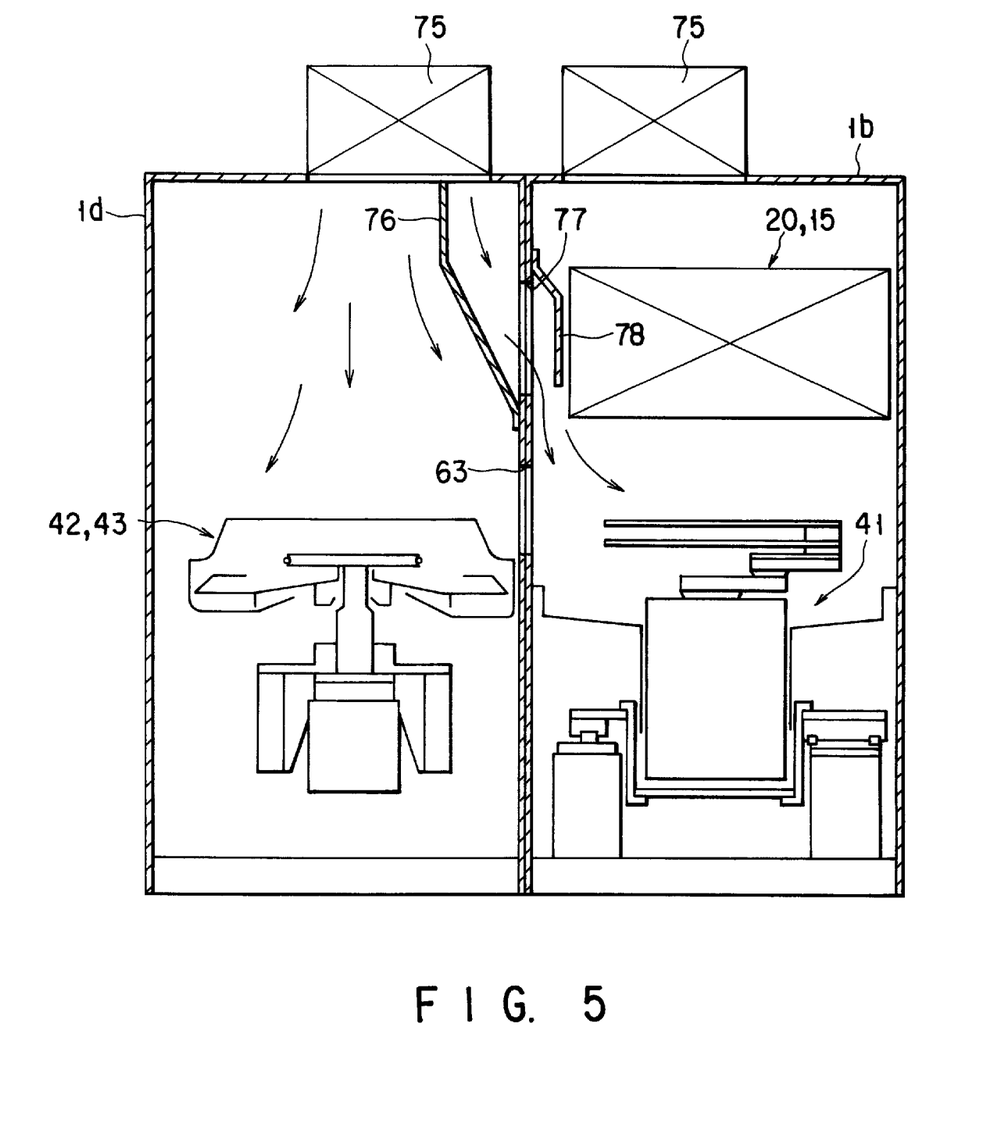
FIG. 5 is an explanatory view showing a structure for introducing pure air into the robot.

The robot 41 is so provided that, on the lateral side of a plurality of juxtaposed spin processing units, a pair of spin processing sections 42, 43 in this embodiment, and below the above-mentioned ultraviolet ray irradiation apparatus 15 and brush washing unit 20, the robot is movable to the second processing unit 1b, as shown in FIG. 5, along juxtaposed direction of the paired spin processing sections 42, 43. That is, on the lateral side of the above-mentioned spin processing sections 42, 43, as shown in FIG. 3, a guide rail 44 is provided as constituting a guide section and a linear motor 45 is provided as a drive device spaced a predetermined distance away from, and in parallel with, the guide rail 44.

On the guide rail 44 a slider 46 is so provided as to be slidable and on the upper surface of the slider 46 a first horizontal member 47 is provided.

The above-mentioned linear motor 45 comprises a fixed section 45a and a movable section 45b driven along the fixed section 45a. On the movable section 45b a second horizontal member 49 is mounted. From a second horizontal member 49 a second vertical member 51 is suspended.

Between the lower end portions of the first vertical member 48 and the second vertical member 51 a rest plate 52 is horizontally attached and the above-mentioned robot 41 is set and fixed on the rest plate 52. The robot 41 has a columnar body section 41a and the columnar body section 41a has a diameter smaller in dimension than a distance between the paired vertical members 48, 51.

The above-mentioned guide rail 44 and fixed section 45a of the linear motor 45 are covered with covers 53a, 53b made of a material such as a high corrosion-resistant metal and synthetic resin.

The respective covers 53a, 53b have their upper end sections fixed to a frame 54 provided along a running direction of the above-mentioned robot 41, their intermediate sections downwardly inclined toward the robot 41 and covering the guide rail 44 and fixed section 45a of the linear motor 45, respectively, and their lower end portions inserted between the respective vertical members 48, 51 on one hand and the robot 41 on the other hand.

On the lower end sides of the paired covers 53a, 53b a third drain pan 55 is provided in a whole length range over which the robot 41 is run, the third drain pan being made of a high corrosion-resistant material. As will be set out below, the washing liquid dropping from the robot 41 onto the covers 53a, 53b are collected into the third drain pan 55.

Figure 4:
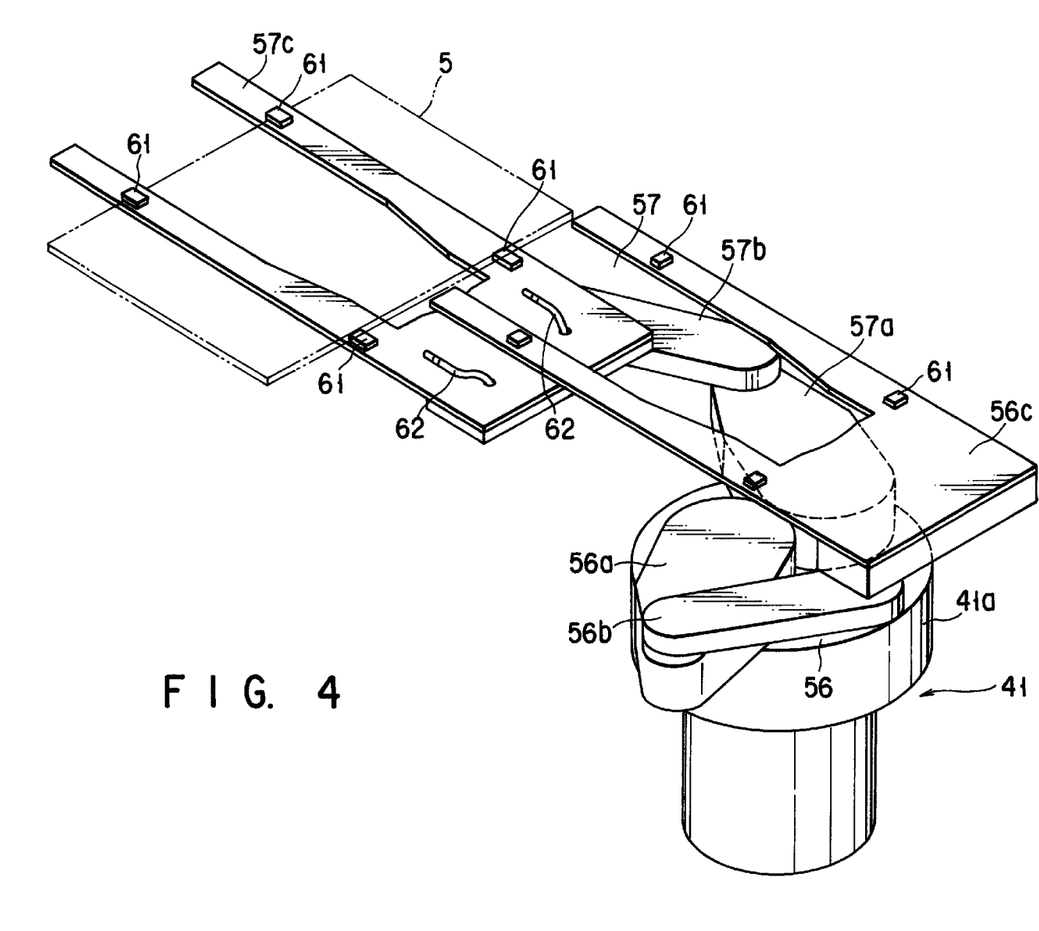
FIG. 4 is a perspective view showing the robot.

The robot 41 is comprised of a twin arm robot as shown, for example, in FIG. 4 and a drive source, not shown, is provided within the body section 41a. A first arm 56 and second arm 57 are mounted on the upper surface of the body section 41a. The first arm 56 comprises a first link 56a and second link 56b and the second arm 57 comprises a third link 57a and fourth link 57b. One end portions of the first link 56a and third link 57a are coupled to the corresponding drive shaft of the above-mentioned drive source.

One end of the second link 56b is so coupled to the other end of the first link 56a as to be swung in interlock with the rotation of the first link. Further, one end of the fourth link 57b is so coupled to the other end of the third link 57a as to be swung in interlock with the third link 57a. To the other end sides of the second link 56b and fourth link 57b the first setter 56c and one end of the second setter 57c are so coupled that a linear motion (extension/contraction motion) is provided in interlock with the swinging motion of the second link 56b and fourth link 57b.

Therefore, the first and second arms 56 and 57 in the pair are such that, with the swinging motion of the first link 56a and third link 57a, the second link 56b and fourth link 57b and the first setter 56c and second setter 57c are, respectively, moved in an interlocking way to provide an extension/contraction motion. Further, the first and second arms 56 and 57 allow an up/down drive motion as well as a change in the extension/contraction direction. FIG. 4 shows a state in which the first arm 56 is contracted and the second arm 57 is extended.

When the paired arms 56, 57 are contracted, the first link 56a and third link 57a and the first setter 56c and second setter 57c are so provided that, in order to prevent their interferences, their height are set in different levels. In this embodiment, the second arm 57 is set to be lower in height than the first arm 56.

The first arm 56 conveys a glass substrate 5 in a dried state only and the second arm 57 conveys a glass substrate in a wet state only.

In the first setter 56c and second setter 57 of the arms 56 and 57 a plurality of retaining members 61 are provided for positioning the glass substrate of a predetermined size. Further, a pair of nozzles 62 are provided at the upper surface of a base portion of the second setter 57c for the second arm 57. From the respective nozzles 62, for example, pure water is jetted as a liquid for preventing drying up of the glass substrate retained in place at the second setter 57c.

That is, the wet glass substrate 5 passed to the second passing mechanism 31 after being washed by the brush washing unit 20 is received by the second setter 57c of the second arm 57. Then, the glass substrate 5 is supplied to the first spin processing section 42 or second spin processing section 43. At that time, since the respective spin processing sections 42, 43 are of a batch processing type, they have to wait for a predetermined time until the glass substrate 5 in the wet state is supplied. During the waiting state, the pure water is jetted from the nozzles 62 toward the glass plate. Since, by doing so, the glass plate 5 in the wet state is prevented from being dried, it is possible to prevent a stain, etc., from being formed due to the drying of the glass plate.

The paired spin processing sections 42, 43 perform the same processing on the glass substrate 5. That is, they are spun at high speeds with the glass substrate 5 held in place and, on the upper surfaces, a chemical solution to which an ultrasonic oscillation is applied is supplied from a corresponding chemical solution supply nozzle 65. After the chemical solution washing, pure water is supplied from a pure water supply nozzle 66 to the glass water for a rinse. Then, without supplying any chemical solution and pure water to the glass plate 5, the processing unit performs dry processing while being spun at high speeds.

The ultraviolet ray irradiation apparatus 15 and brush washing unit 20 perform continuous processing on the glass substrate 5, while, on the other hand, the processing of the glass substrate 5 by the spin processing sections 42, 43 is of a batch processing type. For this reason, the flow of the glass substrate 5 is non-continuous, thus taking a longer tact time.

As set out above, however, a plurality of spin processing sections 42, 43 are juxtaposed for processing the glass substrate 5 and the glass substrate 5 from the brush washing unit 20 is alternately supplied to the spin processing sections. For this reason, in comparison with the case where a single glass substrate for a liquid crystal is sequentially processed with a single spin processing unit, it is possible to shorten a tact time of a washing processing apparatus as a whole.

The glass substrate 5, being in a dried state after being subjected to dry processing by the respective processing sections 42, 43, is picked up by the first setter 56c of the first arm 56 of the robot 41 and conveyed to a fifth processing unit 1e.

The attachment and detachment of the glass substrate 5 by the robot 41 to and from the respective spin processing sections 42, 43 are effected though an opening 63 connecting the second processing unit 1b and forth processing unit 1d. The opening 63 may be opened and closed by a gate not shown.

The above-mentioned robot 41 passes the glass substrate in a wet state by the second arm 57 and passes the glass substrate 5 in a dry state, by the first arm 56, which has been subjected to wash processing. For this reason, no spot on the wet-state glass substrate 5 is deposited on the first setter 56c of the first arm 56 and a glass substrate in a clean state passed by the first setter 56c is not soiled by the robot 41.

Further, the first arm 56 is situated above the second arm 57 and there is no possibility that the first setter 56c of the first arm 56 and glass substrate retained at that place will be soiled by a washing solution dropped from a wet-state glass substrate 5 retained at the second setter 57c of the second arm 57.

In the case where the second arm 57 of the robot 41 supply the glass substrate 5 in the wet state to any one of the paired spin processing sections 42, 43, the robot 41 is driven by a linear motor 45 and run along the guide rail 44. At this time, the wash solution drops from the glass substrate 5 in the wet state onto the upper surfaces of the intermediate portions of the paired covers 53a, 53b.

Since the intermediate portions of the covers 53a, 53b are downwardly inclined toward the robot 41, the washing solution dropped onto the intermediate portions of the covers 53a, 53b is collected from these intermediate portions of the covers through the lower end portions into the third drain pan 55.

That is, the washing solution dropped from the wet-state glass substrate 5 is prevented from dropping onto the guide rail 44 for guiding the running of the robot 41 to cause an earlier corrosion to occur at the guide rail 44 and from dropping onto the linear motor 45 to cause it to be injured.

The above-mentioned fifth processing unit 1e has a convey-out section 71 comprised of the plurality of rollers as shown in FIG. 1. On a one-end side of the conveying-out section 71, a pusher 72 for receiving the glass substrate retained on the first setter 56c of the first arm 56 of the robot 41 is so provided as to be up/down movable.

When the pusher 72 is lifted and receives the glass substrate 5 from the first setter 56c, it is lowered and passes the glass substrate 5 to the convey-out section 71. An unloader section 73 is arranged on the other end of the convey-out section 71 and the glass substrate 5 conveyed to the convey-out section 71 is stacked and received in the unloader section 73. A flow of the glass substrate 5 through the wash processing apparatus is indicated by arrows in FIG. 1.

The above-mentioned wash processing apparatus 1 is installed in a clean room and cleaning units 75 are provided on the outer surfaces of the upper sections of the processing units 1a to 1e as shown in FIG. 5. The cleaning unit 75 purifies air in the cleaning room and introduces it to the processing units 1a to 1e.

In the second processing unit 1b, the robot 41 is located below the brush washing unit 20. For this reason, the pure air supplied from the cleaning unit 75 on the upper section of the second processing unit 1b is blocked by the brush washing unit 20 and it becomes difficult to maintain the purity level of the glass substrate 5 retained by the robot 41.

There, at the upper section of the fourth processing unit 1d juxtaposed relative to the second processing unit 1b, a first guide 76 is provided for branching a portion of the pure air from the cleaning unit 75. As indicated by arrows in the Figure, the pure air branched by a first guide 76 is guided into a communication hole 77 for allowing a communication between the fourth processing unit 1d and the second processing unit 1b.

A second guide 78 for guiding the pure air which enters via the communication hole 77 down toward a lower zone is provided at the second processing unit 1b. By doing so, the pure air flows toward the robot 41 so that it is possible to maintain the purity level of the glass substrate retained at the robot 41.

According to the wash processing apparatus thus structured, the ultraviolet ray irradiation apparatus 15 and brush washing unit 20 are arranged at the upper stage as a section of processing the glass substrate 5 and the robot 41 is arranged at the lower stage as such a processing section.

For this reason the width dimension of the wash processing apparatus as a whole can be made smaller than in the case where the above-mentioned robot 41 is provided side by side in a horizontal direction relative to the ultraviolet ray irradiation apparatus 15 and brush washing unit 20. And its space for occupying a clean room can be made smaller to that extent.

The direction in which the glass substrate 5 is conveyed is turned back between at the upper stage at which the ultraviolet ray irradiation apparatus 15 and brush washing unit 20 are arranged and at the lower stage at which the robot 41 is arranged. For this reason, the whole length of the present apparatus can be made shorter than in the case where the direction in which the glass substrate 5 is conveyed is not turned back. By doing so, a smaller occupation space can be secured in the cleaning room.

The ultraviolet ray irradiation apparatus 15 and brush washing unit 20 at the high stage and the robot 41 at the lower stage are arranged in two stages. A first passing mechanism 6 is provided at the entry side of the upper-stage ultraviolet ray irradiation apparatus 15 and a second passing mechanism 31 is provided at the exit side of the brush washing unit 20.

For this reason, even if a plurality of processing sections are arranged in an up/down two stages, it is possible to positively pass the glass substrate 5 from the loader section 4 to the ultraviolet ray irradiation apparatus and from the brush washing unit 20 to the robot 41.

By arranging the ultraviolet ray irradiation apparatus 15 and brush washing unit 20 at the upper stage and the robot 41 at the lower stage, a down flow from the upper section of the second unit 1b is prevented by the upper-stage processing section.

However, a portion of a downflow from the fourth processing unit 1d set relative to the second processing unit 1b in a side-by-side way is branched by the first guide body 76 and, past the communication hole 77 connecting the second and fourth processing units 1b, 1d, guided by a second guide 78 toward the robot 41.

Thus, the wash-processed glass substrate 5 retained by the robot 41 has its purity level maintained by the pure air from the fourth processing unit 1d set adjacent to the second processing unit 1b. That is, even if a plurality of processing sections are arranged in the up/down two stage, the purity level of the processing section arranged at the down stage can be positively maintained by the purity air from the cleaning unit 75.

INDUSTRIAL APPLICABILITY

The present invention is not restricted to the above-mentioned one embodiment and various changes and modifications of the present invention can be made. Although, in the above-mentioned one embodiment, the washing processing apparatus is taken by way of example, even if the apparatus performs any other processing, the present invention can be applied to this apparatus in the case where it has a plurality of processing sections.

For example, the present invention can be applied to a processing apparatus equipped with those processing sections performing processing, such as a develop processing, etching processing and thin-film forming processing, so as to form a circuit pattern on a semiconductor wafer or a liquid crystal glass substrate as a material for instance. The present invention is not restricted to the kinds of processing sections, a combination of them or kinds, etc., of the materials.

Although, in the above-mentioned one embodiment, the material held in the loader section is supplied by the first passing mechanism to the processing section at the upper stage and the material processed by the final processing section at the upper stage is passed by the second passing mechanism to the processing section at the lower stage, it may be possible that, depending upon the state in which the processing sections are arranged, the material at the loader section is passed by the first passing mechanism to the processing sections at the lower stage and the material processed at the lower stage is passed by the second passing mechanism to the processing section at the upper stage. In that case, if the loader section and lower-stage processing section are at the same height, it may be possible that the first passing mechanism is up/down movable.

Further, although a plurality of spin processing sections are arranged in one processing unit, these spin processing sections may be arranged separately and, at that point, design modification can be made depending upon the size of the processing section and processing unit.

Although, in the above-mentioned embodiment, the ultraviolet ray irradiation apparatus and brush washing unit are arranged at the upper area, the robot is arranged below, and the spin processing section is arranged at the side of the robot and diagonally below the ultraviolet ray irradiation apparatus and brush washing section, it is needless to say that the robot and spin processing section are arranged beneath the ultraviolet ray irradiation apparatus and brush washing section. In this case, the loader section and unloader section may be arranged in an up/down direction.

What is claimed is:

1. A robot apparatus including a first arm and second arm having a plurality of links connected to be swingable and each having a setter for retaining a material at a forward end and movable in extension/contraction motion, characterized in that the setter of the first arm is located at a height position than the setter of the second arm and, with the material retained at the second arm, nozzles are provided to direct a liquid to be jetted onto the retained material.

2. A processing apparatus for performing processing on a material comprising:

a plurality of processing sections arranged at upper and lower stages in an up/down two-stage way, said plurality of processing sections are provided at any one of the upper stage or lower stage, and convey-in/convey-out means is provided near these processing sections to convey the material to and from the respective processing sections, said convey-in/convey-out means is arranged at the lower stage, the other processing section is arranged near the convey-in/convey-out means and branch flow means is provided, between the convey-in/convey-out means in the above-mentioned processing section, for allowing a portion of pure air, which is supplied to the above-mentioned other processing section to be branched to the convey-in/convey-out means;

a loader section arranged opposite to that processing section situated at one end of any one of an upper stage or lower stage and retaining a not yet processed material;

an unloader section arranged opposite to that processing section situated at one end of the other of the upper stage or lower stage and storing a processed material;

a first passing means for supplying the not yet processed material from the loader section to that processing section situated at one end of any one of the upper stage or lower stage; and a second passing means for receiving the material from the processing section situated at the other end of any one of the upper stage or lower stage and for supplying the material to that processing section situated at the other end of the other of the upper stage or lower stage.

3. A processing apparatus for performing processing on a material comprising:

a plurality of processing sections arranged at upper and lower stages in an up/down two-stage way;

a loader section arranged opposite to that processing section situated at one end of any one of an upper stage or lower stage and retaining a not yet processed material;

an unloader section arranged opposite to that processing section situated at one end of the other of the upper stage or lower stage and storing a processed material;

a first passing means for supplying the not yet processed material from the loader section to that processing section situated at one end of any one of the upper stage or lower stage; and a second passing means for receiving the material from the processing section situated at the other end of any one of the upper stage or lower stage and for supplying the material to that processing section situated at the other end of the other of the upper stage or lower stage, said second passing means comprising a conveying mechanism for conveying the material, liquid supply means for supplying a dry-up preventing liquid to the material conveyed by the conveying mechanism, a drain pan provided at the lower surface side of the conveying mechanism and, while collecting the liquid supplied from the liquid supply means, up/down movable as a unit integral with the conveying mechanism, a movable pipe connected to the drain pan and discharging the liquid collected at the drain pan, and a fixed pipe for allowing the movable pipe to be slidably inserted therein.

4. A processing apparatus for performing processing on a material comprising:

a plurality of processing sections arranged at upper and lower stages in an up/down two-stage way;

a loader section arranged opposite to that processing section situated at one end of any one of an upper stage or lower stage and retaining a not yet processed material;

an unloader section arranged opposite to that processing section situated at one end of the other of the upper stage or lower stage and storing a processed material;

a first passing means for supplying the not yet processed material from the loader section to that processing section situated at one end of any one of the upper stage or lower stage;

a second passing means for receiving the material from the processing section situated at the other end of any one of the upper stage or lower stage and for supplying the material to that processing section situated at the other end of the other of the upper stage or lower stage; and a fixed roller unit arranged at a predetermined height on the convey-out side of a predetermined processing unit and receives the material conveyed from the processing section, the second passing means is comprised of a movable roller unit movable in an up/down direction, juxtaposed relative to the fixed roller unit at a lifted position and receives the material passed to the fixed roller unit, and moved down, first and second water-proof covers have inclined sections at one end sides of the fixed roller unit and movable roller unit brought to be made adjacent to each other when the movable roller unit is lifted, the inclined sections being downwardly inclined towards the insides of these roller units, and the inclined section of the second water-proof cover provided on the movable roller unit is brought to a position overlappingly located below the inclined section of the water-proof cover of the fixed roller unit when the movable roller unit is lifted.

5. A processing apparatus according to claim 2, wherein the convey-in/convey-out means comprises a guide provided along a moving direction, a drive device provided parallel to, and at a predetermined interval relative to, the guide, a robot arranged between the guide and the drive device, so supported as to be freely run by the guide and the drive device, and driven by the drive device along the running direction, and covers for covering the guide and drive device at both sides of the running direction of the robot.

* * * * *